(12) United States Patent
Ko et al.

(10) Patent No.: US 9,159,947 B2
(45) Date of Patent: Oct. 13, 2015

(54) ORGANIC LIGHT-EMITTING DEVICE

(75) Inventors: Hee-Joo Ko, Yongin (KR); Chang-Ho Lee, Yongin (KR); Il-Soo Oh, Yongin (KR); Se-Jin Cho, Yongin (KR); Hyung-Jun Song, Yongin (KR); Jin-Young Yun, Yongin (KR); Jong-Hyuk Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 452 days.

(21) Appl. No.: 13/064,016

(22) Filed: Mar. 2, 2011

(65) Prior Publication Data

US 2011/0233531 A1  Sep. 29, 2011

(30) Foreign Application Priority Data

Mar. 29, 2010 (KR) .................. 10-2010-0028080

(51) Int. Cl.
*H01L 51/54* (2006.01)
*H01L 51/52* (2006.01)
*H01L 51/50* (2006.01)

(52) U.S. Cl.
CPC ......... *H01L 51/5206* (2013.01); *H01L 51/5088* (2013.01); *Y10S 428/917* (2013.01)
USPC ........... 428/690; 428/917; 313/504; 313/506; 257/40

(58) Field of Classification Search
CPC ..................... H01L 51/5088; H01L 51/5206
See application file for complete search history.

(56) References Cited

U.S. PATENT DOCUMENTS

| 5,714,838 | A | 2/1998 | Haight et al. | |
| 6,278,236 | B1* | 8/2001 | Madathil et al. | 313/504 |
| 2002/0158242 | A1 | 10/2002 | Son et al. | |
| 2004/0113547 | A1* | 6/2004 | Son et al. | 313/504 |
| 2006/0014044 | A1 | 1/2006 | Ko et al. | |
| 2006/0240280 | A1 | 10/2006 | Liao et al. | |
| 2006/0279190 | A1* | 12/2006 | Nakayama | 313/113 |
| 2007/0102698 | A1* | 5/2007 | Kang et al. | 257/40 |
| 2007/0205716 | A1* | 9/2007 | Chen et al. | 313/506 |
| 2008/0111484 | A1 | 5/2008 | Kwon et al. | |
| 2008/0150422 | A1* | 6/2008 | Ohara | 313/504 |
| 2008/0252204 | A1 | 10/2008 | Yoshida et al. | |
| 2008/0305361 | A1* | 12/2008 | Inoue et al. | 428/691 |
| 2009/0087546 | A1 | 4/2009 | Ilzumi et al. | |
| 2009/0091242 | A1* | 4/2009 | Liao et al. | 313/504 |
| 2009/0191427 | A1 | 7/2009 | Liao et al. | |
| 2009/0218934 | A1* | 9/2009 | Song et al. | 313/504 |

(Continued)

FOREIGN PATENT DOCUMENTS

| CN | 1649459 A | 8/2005 |
| CN | 1988207 A | 6/2007 |

(Continued)

OTHER PUBLICATIONS

Di et al., Appl. Phys. Lett., 90, 133508, (2007).*

(Continued)

*Primary Examiner* — Dawn Garrett
(74) *Attorney, Agent, or Firm* — Lee & Morse, P.C.

(57) ABSTRACT

An organic light-emitting device, including a first electrode, the first electrode having a smaller absolute value of a work function energy level than an absolute value of a work function energy level of ITO, a second electrode facing the first electrode, and an organic layer between the first electrode and the second electrode.

6 Claims, 3 Drawing Sheets

(56) References Cited

U.S. PATENT DOCUMENTS

| | | | |
|---|---|---|---|
| 2009/0315452 A1* | 12/2009 | Lim et al. | 313/504 |
| 2011/0210317 A1* | 9/2011 | Song et al. | 257/40 |

FOREIGN PATENT DOCUMENTS

| | | |
|---|---|---|
| CN | 101094543 A | 12/2007 |
| CN | 101222027 A | 7/2008 |
| CN | 101383400 A | 3/2009 |
| CN | 101447555 A | 6/2009 |
| JP | 2009-87782 | 4/2009 |
| JP | 2009-514243 A | 4/2009 |
| JP | 2009-283787 A | 12/2009 |
| KR | 10 1998-0024082 A | 7/1998 |
| KR | 10 2004-0000630 A | 1/2004 |
| KR | 10 2006-0012120 A | 2/2006 |
| KR | 10 2007-0071978 A | 7/2007 |
| KR | 10-0787461 B1 | 12/2007 |
| TW | I241864 | 10/2005 |
| TW | I280269 | 5/2007 |
| TW | 201006305 | 2/2010 |
| TW | 201008934 | 3/2010 |
| WO | WO 2007/066898 A1 | 6/2007 |
| WO | WO 2009/091231 A2 | 7/2009 |
| WO | WO 2009/091231 A3 | 7/2009 |
| WO | WO-2009/097108 A1 | 8/2009 |

OTHER PUBLICATIONS

Chinese Office Action in CN 201110058208.5, dated Mar. 19, 2013 (Ko, et al.).

Japanese Office Action in JP 2011-015523, dated May 8, 2012 (Ko, et al.).

* cited by examiner

ORGANIC LIGHT-EMITTING DEVICE

BACKGROUND

1. Field

Embodiments relate to an organic light-emitting device.

2. Description of the Related Art

Cathode ray tube (CRT) displays have been increasingly replaced with flat displays as information displays so as to transmit and receive information anytime, and anywhere. Of the flat displays, a liquid crystal display (LCD) is light, and has low power consumption, and thus has been widely used recently. However, since an LCD is a passive emission type device, not a self emission type device, the LCD has a restriction in terms of brightness, a contrast ratio, a viewing angle, a large area, or the like. Thus, to overcome these problems, research has widely and actively been conducted into new flat displays. Of the new flat displays, an organic light emitting diode (OLED) device is a self emission type device, can be driven at a low voltage, can be easily made to be thin, and has advantages such as a wide viewing angle and a fast response speed.

SUMMARY

It is a feature of an embodiment to provide an organic light-emitting device having a long lifetime.

At least one of the above and other features and advantages may be realized by providing an organic light-emitting device, including a first electrode, the first electrode having a smaller absolute value of a work function energy level than an absolute value of a work function energy level of ITO, a second electrode facing the first electrode, and an organic layer between the first electrode and the second electrode.

A metal of the first electrode may include silver, aluminum, or an alloy of silver and aluminum.

The organic layer may include a hole injection layer, the hole injection layer having a greater absolute value of an energy level of a lowest unoccupied molecular orbital than an absolute value of a work function energy level of a metal of the first electrode.

The organic layer may include a hole injection layer, the hole injection layer including a non-oxide having a greater absolute value of an energy level of a lowest unoccupied molecular orbital than an absolute value of a work function energy level of a metal of the first electrode.

The organic layer may include a hole injection layer, the hole injection layer including an oxide material having a greater absolute value of an energy level of a lowest unoccupied molecular orbital than an absolute value of a work function energy level of a metal of the first electrode.

The organic layer may include a hole injection layer, the hole injection layer including a non-oxide material having a greater absolute value of an energy level of a lowest unoccupied molecular orbital than an absolute value of a work function energy level of a metal of the first electrode, and a thickness of the hole injection layer may be about 50 Å to about 100 Å.

The organic layer may include a hole injection layer, the hole injection layer including an oxide material having a greater absolute value of an energy level of a lowest unoccupied molecular orbital than an absolute value of a work function energy level of a metal of the first electrode, and a thickness of the hole injection layer may be about 100 Å to about 800 Å.

The organic layer may include a hole injection layer, and the hole injection layer may include 1,4,5,8,9,12-hexaaza-triphenylene-2,3,6,7,10,11-hexacarbonitrile, hexadecafluorophthalocyaninatocopper, or a mixture thereof.

The hole injection layer may include the mixture of 1,4,5,8,9,12-hexaaza-triphenylene-2,3,6,7,10,11-hexacarbonitrile and hexadecafluorophthalocyaninatocopper.

The organic layer may include a hole injection layer, and the hole injection layer may include $MoO_x$ (X is in the range of 2 to 6), $W_xO_y$ (x is in the range of 1 to 18, and y is in the range of 2 to 49), or a mixture thereof.

The organic layer may include a hole injection layer, and the hole injection layer may contact the first electrode.

The organic layer may include a hole injection layer, and a portion of the first electrode that contacts the hole injection layer may be in an oxide-free state.

The organic layer may have a thickness of about 800 Å to about 1,500 Å.

The first electrode may be a positive electrode, and the second electrode may be a negative electrode.

The first electrode may have a thickness of about 200 Å to about 5,000 Å.

At least one of the above and other features and advantages may also be realized by providing an organic light-emitting diode display, including a positive electrode having a metal surface thereof, the metal surface including at least one of silver and aluminum, an organic layer, the organic layer including a hole injection layer disposed proximate to the metal surface of the positive electrode, the hole injection layer being configured to receive holes from the positive electrode, the hole injection layer including at least one of 1,4,5,8,9,12-hexaaza-triphenylene-2,3,6,7,10,11-hexacarbonitrile, hexadecafluorophthalocyaninatocopper, molybdenum oxide, and tungsten oxide, and a negative electrode, the organic layer being between the positive electrode and the negative electrode.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
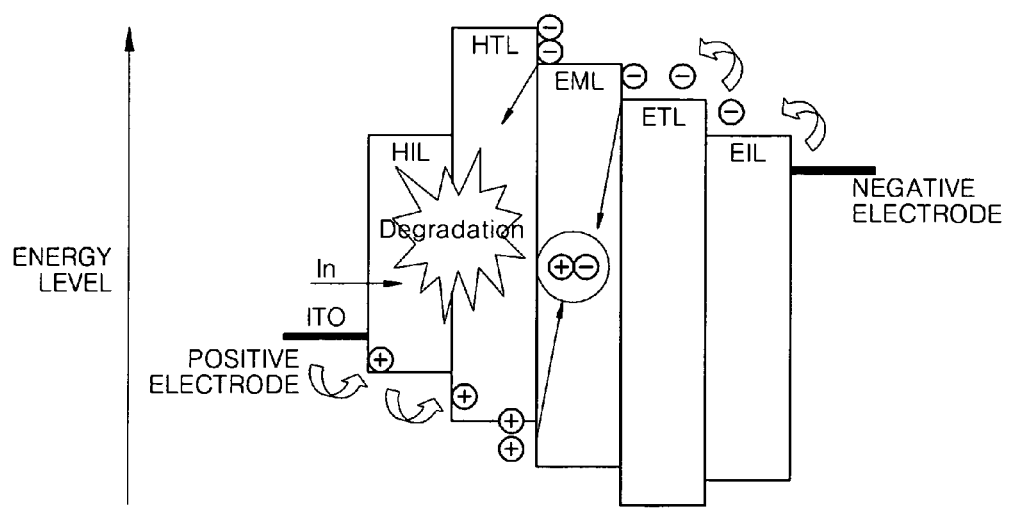
FIG. 1 illustrates a diagram of energy levels of lowest unoccupied molecular orbitals (LUMOs) and highest occupied molecular orbitals (HOMOs) of electrodes and organic layers of a general organic light-emitting device, and an operational principle and degradation principle of the organic light-emitting device.

Korean Patent Application No. 10-2010-0028080, filed on Mar. 29, 2010, in the Korean Intellectual Property Office, and entitled: "Organic Light-Emitting Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a diagram of energy levels of lowest unoccupied molecular orbitals (LUMOs) and highest occupied molecular orbitals (HOMOs) of electrodes and organic layers of a general organic light-emitting device, and an operational principle and degradation principle of the organic light-emitting device.

Generally, a top-emission active matrix organic light emitting diode (AMOLED) device may be configured by thermally-evaporating an organic material on indium tin oxide (ITO) that is a positive electrode having a high work function, and then forming metal having a low work function as a negative electrode by using an appropriate method such as a deposition method.

Referring to FIG. 1, when a voltage is applied to the organic light-emitting device, electrons injected from a negative electrode may accumulate on an interface between a hole transport layer (HTL) and emission layer (EML), and thus organic molecules may be degraded, thereby reducing the lifetime of the organic light-emitting device.

Further, in the positive electrode, indium (In) of the indium tin oxide (ITO) may migrate to a hole injection layer (HIL) or the hole transport layer (HTL), and thus organic molecules may be degraded, thereby reducing the lifetime of the organic light-emitting device. In addition, if dark points are generated due to roughness on a lower silver (Ag) layer for controlling resistance, the lifetime of the organic light-emitting device may also be reduced. Moreover, when processes for forming a positive electrode and an organic layer are separately performed, an unintended oxide layer may be formed on the anode. Such an oxide layer may be detrimental, thereby reducing the lifetime of the organic light-emitting device.

In order to provide a organic light-emitting device for various products such as portable products and television (TV) oriented products, a half life-span of 500 hours or more at 50 mA/cm$^2$ is desired. Thus, there is a need for an organic light-emitting device that has a long lifetime, is resistant to degradation by electrons, and does not exhibit migration of indium (In). In order to obtain such an organic light-emitting device, a positive electrode that causes a reduction in lifetime may be replaced with a metal. In further detail, an anode of ITO may be generally used, as discussed above, such an anode providing a sufficiently high work function energy level so as not to cause an issue with hole injection. However, if metal having a low work function is used instead in order to increase a lifetime, holes may not be smoothly injected into an interface between the metal and an organic material. In such a case, a hole injection layer (HIL) that is resistant to electron attack while lowering a hole injection barrier is desirable.

Figure 2:
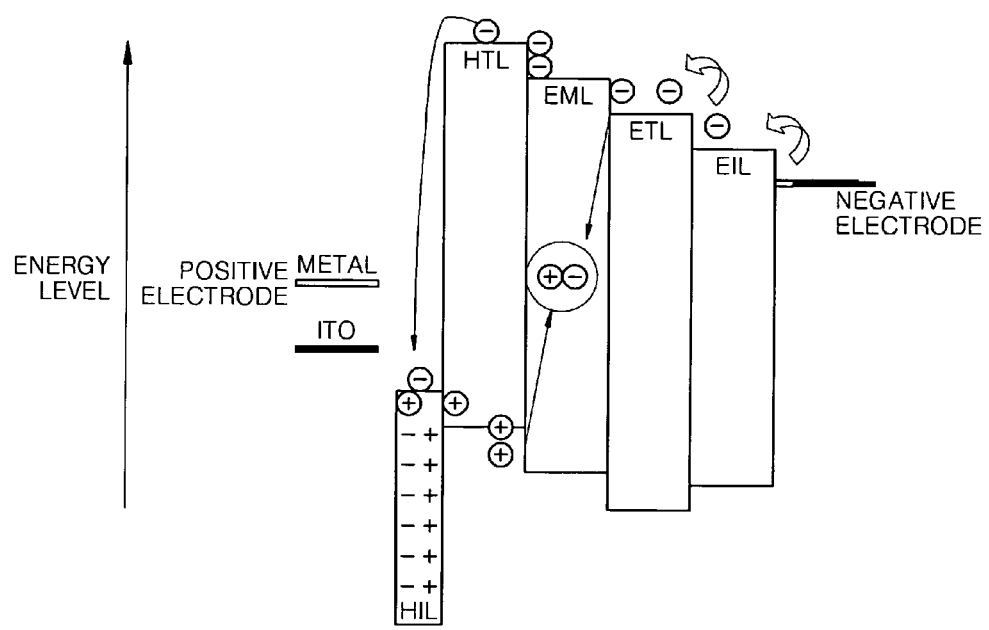
FIG. 2 illustrates a diagram of relative energy levels of elements of an organic light-emitting device according to an embodiment.
Figure 3:
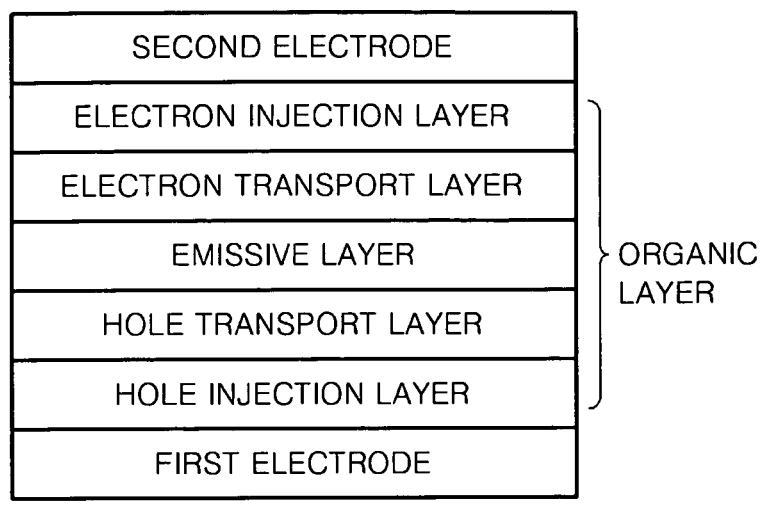
FIG. 3 illustrates an organic light-emitting device according to an embodiment.

FIG. 2 illustrates a diagram of relative energy levels of elements of an organic light-emitting device according to an embodiment, and FIG. 3 illustrates an organic light-emitting device according to an embodiment.

Referring to FIGS. 2 and 3, an organic light-emitting device according to an embodiment may include a first electrode, a second electrode facing the first electrode, and an organic layer disposed between the first electrode and the second electrode. With reference to a work function energy level of comparative ITO, the first electrode may be a metal having a smaller absolute value of a work function energy level than that of ITO. Examples of such a metal are not particularity limited.

According to an embodiment, the metal of the first electrode may be a metal having reflectivity, for example, silver (Ag), aluminum (Al), or an alloy of Ag and Al. Thus, indium (In) may be prevented from migrating into an organic layer.

The first electrode may be a positive electrode, and the second electrode may be a negative electrode. However, the present embodiment is not limited to this case.

The second electrode may be a metal having a low work function energy level of, e.g., 4.3 eV or less, or a combination of such metals, and may be semi-transparent.

Referring to FIG. 3, the organic layer of the organic light-emitting device according to the present embodiment may include an hole injection layer (HIL), a hole transport layer (HTL), an emission layer (EML), an electron transport layer (ETL), and an electron injection layer (EIL), or may include only a combination of some of these layers.

In an implementation, the organic layer of the organic light-emitting device includes the hole injection layer (HIL), and an absolute value of an energy level of a lowest unoccupied molecular orbital (LUMO) of the hole injection layer (HIL) may be greater than that of the metal of the first electrode.

Generally, a tetradecanoylphorbol acetate (TPA)-based compound that may be used as a hole injection layer (HIL) may be advantageous for hole injection from ITO, but is weak to electron attack, thereby reducing a lifetime. Referring to FIG. 2, in the organic light-emitting device according to the present embodiment, an absolute value of an energy level of a LUMO of the hole injection layer (HIL) is greater than an absolute value of an energy level of the metal of the first electrode. The hole injection layer (HIL) having a relatively greater energy level of the LUMO captures electrons transported along the hole transport layer (HTL), thereby preventing hole injection layer (HIL) degradation. In addition, holes are easily injected from the positive electrode with a low work function energy level due to the dipole property of the hole injection layer (HIL).

In more detail, when an electrical field is applied, a positive electrode of the hole injection layer (HIL) is positively charged, and a negative electrode of the hole injection layer (HIL) is negatively charged, due to the dipole property of the hole injection layer (HIL). Electrons injected from a negative electrode easily fall to LUMO of the hole injection layer (HIL) since the LUMO of hole injection layer (HIL) is low. In addition, the electrons are attracted by positive electrical charges of the hole injection layer (HIL), and thus the electrons are easily injected into the hole injection layer (HIL). Accordingly, electrons staying in the hole transport layer (HTL) are easily migrated towards a positive electrode, thereby preventing degradation of the hole transport layer.

According to an embodiment, the organic layer of the organic light-emitting device includes the hole injection layer (HIL), and the hole injection layer (HIL) may include an oxide or non-oxide material having a greater absolute value of a work function energy level of a LUMO than an absolute value of a work function energy level of the metal of the first electrode.

When the hole injection layer (HIL) is formed of the non-oxide material, examples of the non-oxide material may include, but are not limited to, 1,4,5,8,9,12-hexaaza-triphenylene-2,3,6,7,10,11-hexacarbonitrile (HATCN), hexadecafluorophthalocyaninatocopper, or a mixture thereof.

When the hole injection layer (HIL) is formed of the non-oxide material, a thickness of the hole injection layer (HIL) may be about 50 Å to about 100 Å. When the thickness of the hole injection layer (HIL) is in this range, the device may have excellent driving characteristics and lifetime characteristics.

When the hole injection layer (HIL) is formed of the oxide material, examples of the oxide material may include, but are not limited to, $MoO_x$ (X is in the range of 2 to 6), $W_xO_y$ (x is in the range of 1 to 18, and y is in the range of 2 to 49), or a mixture thereof.

When the hole injection layer (HIL) is formed of the oxide material, a thickness of the hole injection layer (HIL) may be about 100 Å to about 800 Å. When the thickness of the hole injection layer (HIL) is in this range, the device may have excellent driving characteristics and lifetime characteristics.

According to an embodiment, the organic layer of the organic light-emitting device includes a hole injection layer (HIL), and the hole injection layer (HIL) contacts the first electrode.

In an implementation, an organic light-emitting device according to an embodiment may be manufactured under an anaerobic condition, e.g., a vacuum condition. Thus, a portion of the first electrode, which contacts the hole injection layer (HIL), may be in an oxide-free state.

According to an embodiment, in the organic light-emitting device, a thickness of the organic light-emitting device may be about 800 Å to about 1,500 Å, and a thickness of the first electrode may be about 200 Å to about 5,000 Å. When, the thickness of the organic layer and the thickness of the first electrode are in these ranges, the device may have excellent driving characteristics and lifetime characteristics.

Hereinafter, a method of manufacturing an organic light-emitting device according to an embodiment will be described with reference to FIG. 3, which illustrates an organic light-emitting device according to an embodiment. Referring to FIG. 3, the organic light-emitting device includes a substrate, a first electrode (positive electrode), a HIL, a HTL, an EML, an ETL, an EIL, and a second electrode (negative electrode).

First, a first electrode material as metal having a smaller absolute value of a work function energy level than that of ITO may be formed on a substrate, e.g., by using a deposition or sputtering method, to form a first electrode.

The subsequent layers are all sequentially formed under an anaerobic condition, for example, a vacuum, or an Ar or $N_2$ atmosphere.

The first electrode may constitute an anode or a cathode. The substrate may be a substrate generally used in organic light-emitting devices, and may include, for example, a glass substrate or a transparent plastic substrate, which has excellent mechanical strength, thermal stability, transparency, surface planarity, handling convenience, and water resistance. The first electrode material may be a metal having a smaller absolute value of a work function energy level than that of ITO, such as Ag, Al or an alloy thereof, and the first electrode may be a transparent or reflective electrode.

Next, the HIL may be formed on the first electrode using, e.g., vacuum deposition. In other implementations, the HIL may be formed on the first electrode using, e.g., spin coating, casting, Langmuir-Blodgett (LB) deposition, or the like.

When the HIL is formed using vacuum deposition, the deposition conditions may vary according to a compound that is used to form the HIL, and the structure and thermal characteristics of the HIL to be formed. For example, the deposition conditions may include a deposition temperature of 100° C. to 500° C., a vacuum pressure of $10^{-8}$ torr to $10^{-3}$ torr, and a deposition rate of 0.01 Å/sec to 100 Å/sec.

When the HIL is formed using spin coating, coating conditions may vary according to a compound that is used to form the HIL, and the structure and thermal properties of the HIL to be formed. For example, the coating conditions may include a coating speed of about 2000 rpm to about 5,000 rpm, and a thermal treatment temperature of about 80° C. to about 200° C., wherein the thermal treatment is for removing a solvent after coating.

Examples of a material for forming the hole injection layer (HIL) may include 1,4,5,8,9,12-hexaaza-triphenylene-2,3,6,7,10,11-hexacarbonitrile, hexadecafluorophthalocyaninatocopper, $MoO_x$ (X is in the range of 2 to 6), $W_xO_y$ (X is in the range of 1 to 18, and y is in the range of 2 to 49), or a mixture thereof.

When the hole injection layer (HIL) is the non-oxide material (for example, 1,4,5,8,9,12-hexaaza-triphenylene-2,3,6,7,10,11-hexacarbonitrile, hexadecafluorophthalocyaninatocopper, or a combination thereof), a thickness of the hole injection layer (HIL) may be about 50 Å to about 100 Å. When the hole injection layer (HIL) is the oxide material (e.g., $MoO_x$ (X is in the range of about 2 to about 6), $W_xO_y$ (X is in the range of 1 about 18, and y is in the range of 2 to 49), or a combination thereof), the thickness of the hole injection layer (HIL) may be about 100 Å to about 800 Å. When the thickness of the HIL is within the above range, the device may have excellent driving characteristics and lifetime characteristics.

Next, the HTL may be formed on the HIL using various methods, for example by vacuum deposition, spin coating, casting, LB deposition, or the like. When the HTL is formed using vacuum deposition or spin coating, the deposition or coating conditions may be similar to those applied to form the HIL, though the deposition or coating conditions may vary according to the material that is used to form the HTL.

Examples of HTL materials that may be used include, but are not limited to, cabazol derivatives such as N-phenylcarbazol or polyvinylcarbazol, and amine derivatives having an aromatic condensed ring, such as NPB, N,N'-bis(3-methylphenyl)-N,N'-diphenyl-[1,1-biphenyl]-4,4'-diamine (TPD), or N,N'-di(naphthalene-1-yl)-N,N'-diphenyl benzidine (α-NPD).

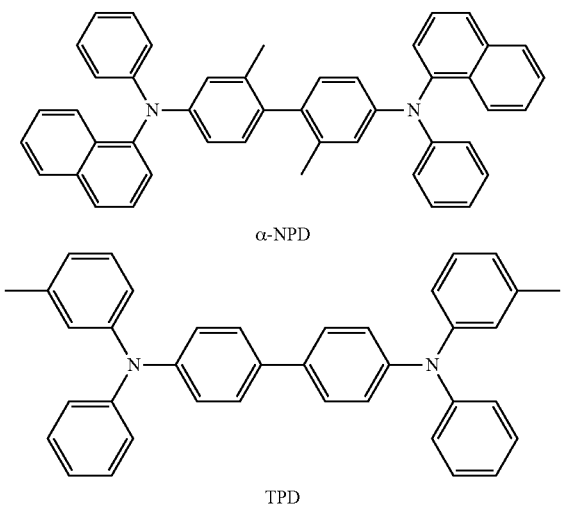

α-NPD

TPD

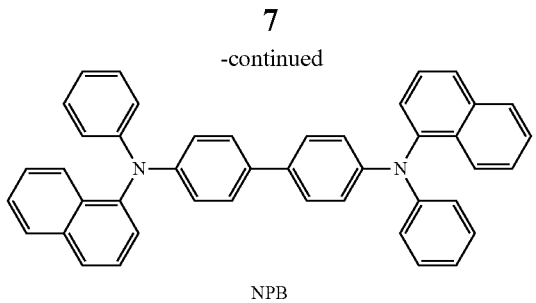

NPB

The HTL may have a thickness of about 50 Å to about 1,000 Å, for example, a thickness of 100 Å to about 700 Å. When the thickness of the HTL is within the above range, the HTL may have excellent hole transport characteristics without a substantial increase in driving voltage.

Next, the EML may be formed on the HTL using various methods, for example, by vacuum deposition, spin coating, casting, LB deposition, or the like. When the EML is formed using vacuum deposition or spin coating, the deposition or coating conditions may be similar to those applied to form the HIL, although the deposition and coating conditions may vary according to the material that is used to form the EML.

The EML may be formed using various light-emitting materials, such as hosts and dopants. Dopants used to form the EML may include, e.g., a fluorescent dopant or a phosphorescent dopant.

Examples of the host may include, but are not limited to, $Alq_3$, 4,4'-N,N'-dicarbazole-biphenyl (CPB), 9,10-di(naphthalene-2-yl)anthracene (ADN), and distyrylarylene (DSA).

Examples of red dopants include, but are not limited to, platinum(II) octaethylporphyrin (PtOEP), $Ir(piq)_3$, $Btp_2Ir(acac)$, and DCJTB.

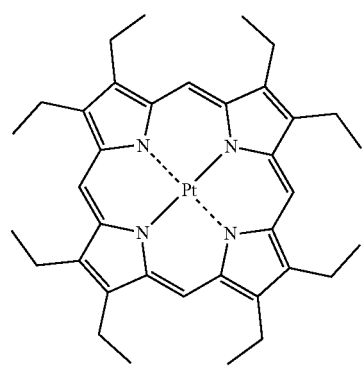

PtOEP

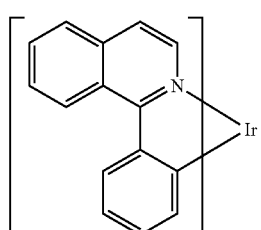

$Ir(piq)_3$

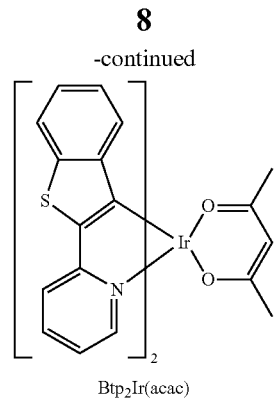

$Btp_2Ir(acac)$

Examples of green dopants include, but are not limited to, $Ir(ppy)_3$ (where "ppy" denotes phenylpyridine), $Ir(ppy)_2(acac)$, $Ir(mpyp)_3$, and C545T

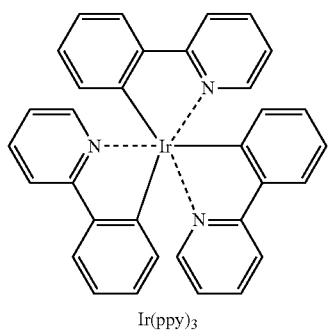

$Ir(ppy)_3$

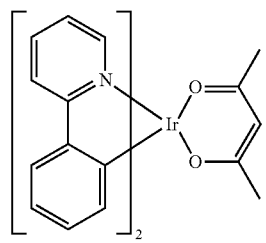

$Ir(ppy)_2(acac)$

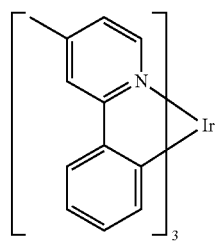

$Ir(mpyp)_3$

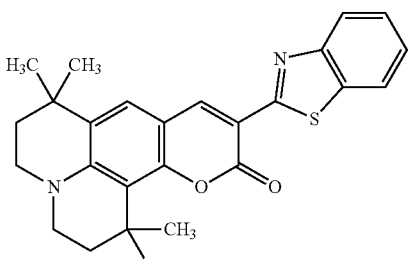

C545T

Examples of blue dopants include, but are not limited to, F$_2$Irpic, (F$_2$ppy)$_2$Ir(tmd), Ir(dfppz)$_3$, ter-fluorene, 4,4'-bis(4-diphenylaminostyryl)biphenyl (DPAVBi), and 2,5,8,11-tetra-t-butyl pherylene (TBP).

based on 100 parts by weight of the EML material, which is equivalent to the total weight of the host and the dopant. When the amount of the dopant is within the above range, concentration quenching may be substantially prevented.

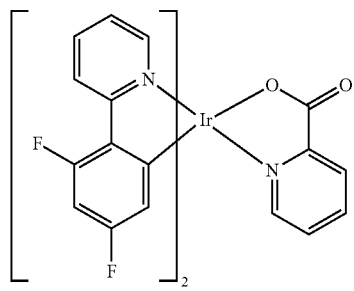

F$_2$Irpic

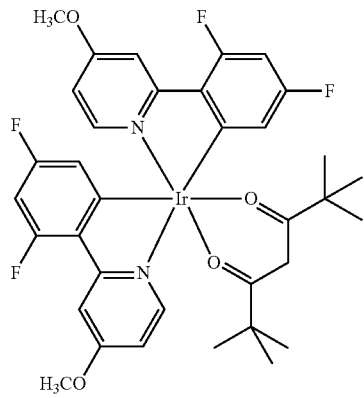

(F$_2$ppy)$_2$Ir(tmd)

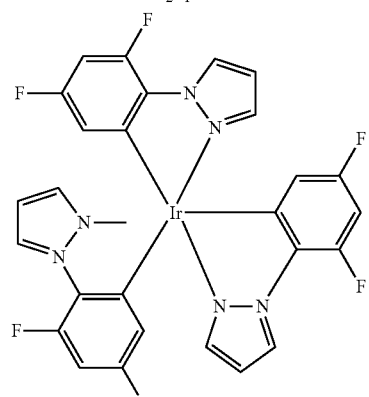

Ir(dfppz)$_3$

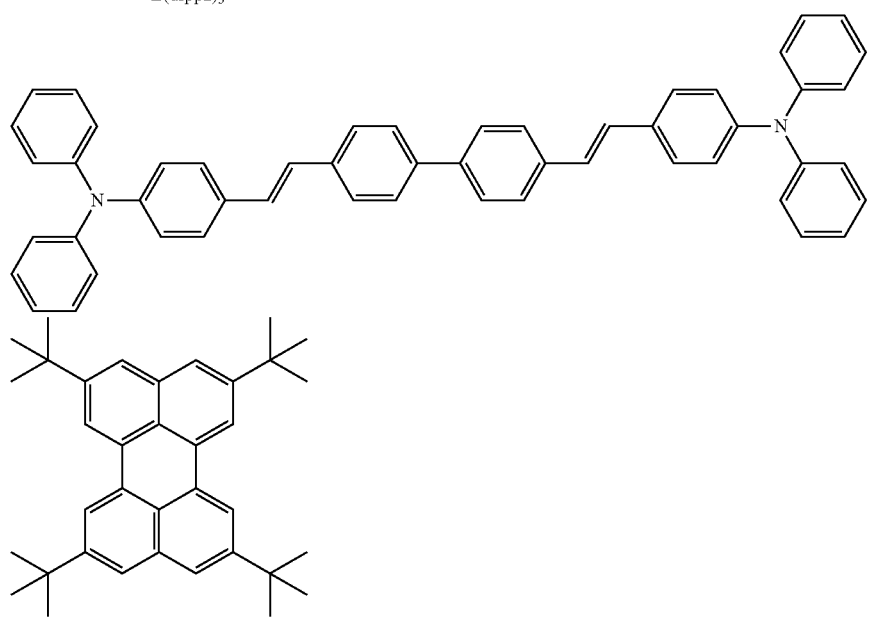

The amount of the dopant may be about 0.1 to about 20 parts by weight, or about 0.5 to about 12 parts by weight, The EML may have a thickness of about 100 Å to about 1,000 Å, for example, about 200 Å to about 600 Å. When the thickness of the EML is within the above range, the EML may have excellent light-emitting characteristics without a substantial increase in driving voltage.

When the EML includes a phosphorescent dopant, a hole blocking layer (HBL, not shown in FIG. 3) may be formed on the EML in order to prevent diffusion of triplet excitons or holes into the ETL. In this case, the HBL may be formed of a general HBL material, examples of which may include, but are not limited to, oxadiazole derivatives, triazole derivatives, phenanthroline derivatives, Balq, and BCP.

The HBL may have a thickness of about 50 Å to about 1,000 Å, for example, about 50 Å to about 100 Å. Providing a thickness of about 50 Å or more may help prevent hole blocking characteristics from being degraded. Providing a thickness of about 1,000 Å or less may help prevent the driving voltage of the organic light emitting device from being increased.

Next, the ETL may be formed on the EML (or HBL) using various methods, for example, by vacuum deposition, spin coating, casting, or the like. When the ETL is formed using vacuum deposition or spin coating, the deposition or coating conditions may be similar to those applied to form the HIL, though the deposition and coating conditions may vary according to the material that is used to form the ETL.

The ETL may be formed of a general ETL material, examples of which include, but are not limited to, quinoline derivatives, such as tris(8-quinolinolate)aluminum ($Alq_3$), TAZ, and Balq.

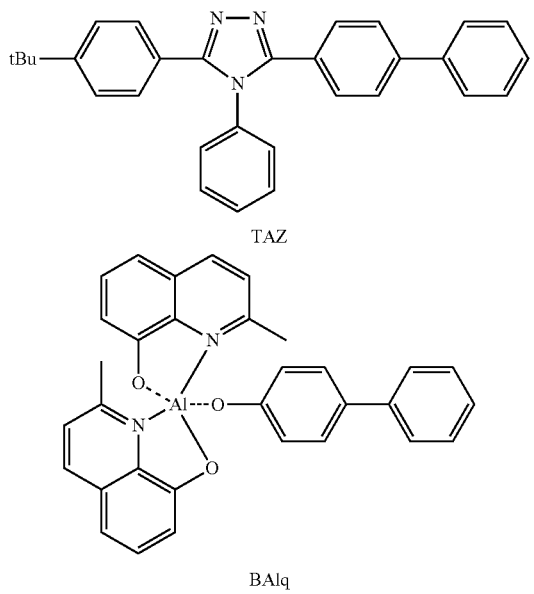

TAZ

BAlq

The ETL may have a thickness of about 100 Å to about 1,000 Å, for example, about 100 Å to about 500 Å. When the ETL has a thickness within the above range, the ETL may have excellent electron transport characteristics without a substantial increase in driving voltage.

In addition, the EIL, which facilitates injection of electrons from the negative electrode, may be formed on the ETL. The EIL may be formed of, e.g., LiF, NaCl, CsF, $Li_2O$, BaO, or the like. The deposition or coating conditions for forming the EIL may be similar to those applied to form the HIL, although the deposition and coating conditions may vary according to the material that is used to form the EIL.

The EIL may have a thickness of about 1 Å to about 100 Å, for example, about 5 Å to about 90 Å. When the EIL has a thickness within the above range, the EIL may have excellent electron injection characteristics without a substantial increase in driving voltage.

Finally, the second electrode may be formed on the EIL using, for example, vacuum deposition, sputtering, or the like. The second electrode may constitute a cathode or an anode. The material for forming the second electrode may include a metal, an alloy, or an electrically conductive compound, which has a low work function, or a mixture thereof. Examples of such materials may include, but are not limited to, lithium (Li), magnesium (Mg), aluminum (Al), aluminum-lithium (Al—Li), calcium (Ca), magnesium-indium (Mg—In), and magnesium-silver (Mg—Ag). In addition, in order to manufacture a top-emission organic light-emitting device, a transparent cathode formed of a transparent material such as ITO or IZO may be used as the second electrode.

The organic light-emitting device according to the present embodiment may be included in various types of flat panel display devices, such as in a passive matrix organic light-emitting display device or in an active matrix organic light-emitting display device. In particular, when the organic light-emitting device is included in an active matrix organic light-emitting display device including a thin-film transistor, the first electrode on the substrate may function as a pixel electrode, electrically connected to a source electrode or a drain electrode of the thin-film transistor.

Hereinafter, one or more embodiments of the present invention will be described in detail with reference to the following examples. These examples are not intended to limit the purpose and scope of the one or more embodiments.

EXAMPLE

Example 1

An anode was prepared by cutting a Corning 15 $\Omega cm^2$ (1200 Å) ITO glass substrate to a size of 50 mm×50 mm×0.7 mm, ultrasonic cleaning using isopropyl alcohol and pure water for 5 minutes each, and then thermally treating for 4 hours. Then, the anode was installed in a vacuum deposition apparatus. The subsequent layers were all continually formed by using thermal evaporation with a vacuum being maintained.

Al having a low work function as a positive electrode was formed in a thickness of 1,500 Å on the substrate by using thermal evaporation.

1,4,5,8,9,12-hexanza-triphenylene-2,3,6,7,10,11-hexacarbonitrile and hexadecafluorophthalocyaninatocopper were deposited as a hole injection layer (HIL) on the positive electrode in a deposition rate of 7:3 in a thickness of 50 Å, and N,N'-di(1-naphthyl)-N,N'-diphenylbenzidine (NPB) was deposited as a hole transport layer (HTL) on the hole injection layer (HIL) in a thickness of 450 Å.

An emission layer (EML) was formed on the hole transport layer (HTL), the emission layer (EML) was formed in a thickness of 150 Å by doping a host 9,10-di(naphthalene-2-yl)anthracene (ADN) with 4,4'-(Bis(9-ethyl-3-carbazovinylene)-1,1'-biphenyl (BCzVBi) as a dopant in a deposition rate of 4%.

Then, bis(10-hydroxyben-zo[h]quinolinato)beryllium (Bebq2) was deposited as an electron transport layer (ETL) in a thickness of 200 Å, LiF as an electron injection layer (EIL) was deposited in a thickness of 10 Å on the electron transport layer (HTL), and then MgAg as a negative electrode was formed on the electron injection layer (EIL) in a deposition rate of 10:1 in a thickness of 140 Å.

A thickness of an organic layer was 860 Å.

Comparative Example 1

ITO was formed as a positive electrode in a thickness of 70 Å. A process for forming a positive electrode and the remaining processes were separately performed, and an oxygen atmosphere existed between the process for forming a positive electrode and the remaining processes. In particular, separately from the process for forming the positive electrode, N,N'-diphenyl-N,N'-bis-[4-(phenyl-m-tolyl-amino)-phenyl]-biphenyl-4,4'-diamine (DNTPD) was formed as a hole injection layer (HIL) in a thickness of 650 Å in a vacuum, a hole transport layer (HTL) formed of the same material as in Example 1 was formed in a thickness of 650 Å, an emission layer (EML) formed of the same material as in Example 1 was formed in a thickness of 200 Å, an electron transport layer (ETL) formed of the same material as in Example 1 was formed in a thickness of 300 Å, an electron injection layer (EIL) formed of the same material as in Example 1 was formed in a thickness of 10 Å, and then a negative electrode formed of the same material as in Example 1 was formed in a thickness of 200 Å to manufacture an organic light-emitting device.

A thickness of an organic layer was 1,810 Å.

Evaluation Example

With respect to the organic light-emitting devices manufactured in Example 1 and Comparative Example 1, current-voltage characteristics, luminescent efficiencies, and lifetimes were measured.

The results are shown in Table 1, below.

TABLE 1

|  | Driving voltage (V) | Current density (mA/cm$^2$) | Luminescent efficiency (cd/A) | Half life-span (hr @50 mA/cm$^2$) |
| --- | --- | --- | --- | --- |
| Example 1 | 3.3 | 10 | 3.7 | 6,000 |
| Comparative Example 1 | 4 | 10 | 2.8 | 700 |

Referring to FIG. 1, a driving voltage of the organic light-emitting device prepared in Example 1 was lower than that of the organic light-emitting device prepared in Comparative Example 1. In addition, with respect to luminescent efficiencies and lifetimes, the organic light-emitting device prepared in Example 1 was excellent compared to the organic light-emitting device prepared in Comparative Example 1.

An organic light-emitting device according to an embodiment may use a metal as a positive electrode. Thus, indium (In) does not migrate, and the organic light-emitting device may be resistant to electron attack, thereby obtaining a long lifetime. The organic light-emitting device may include a metal as a first electrode having a smaller absolute value of a work function energy level than an absolute value of a work function energy level of indium tin oxide (ITO).

An organic light-emitting device according to an embodiment may use a hole injection layer (HIL). Thus, holes may be smoothly injected, and the organic light-emitting device may be resistant to electron attack, thereby obtaining a long lifetime.

The organic light-emitting device including the metal as the positive electrode and the hole injection layer (HIL) may be used to form a thin film device that has a long lifetime and has no dark point.

The organic light-emitting device according to an embodiment may be manufactured using an in-situ process, and thus an upper portion of the positive electrode may be not be oxidized, thereby obtaining a long lifetime.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An organic light-emitting device, comprising:
    a first electrode including an indium tin oxide (ITO)-inclusive layer and a metal layer disposed over the ITO-inclusive layer, a metal of the metal layer having a smaller absolute value of a work function energy level than an absolute value of a work function energy level of the ITO;
    a second electrode facing the first electrode; and
    an organic layer between the first electrode and the second electrode, wherein a portion of the first electrode contacting the organic layer is in a substantially oxide-free state,
    wherein the organic layer includes a hole injection layer, and
        the hole injection layer includes 1,4,5,8,9,12-hexaaza-triphenylene-2,3,6,7,10,11-hexacarbonitrile, hexadecafluorophthalocyaninatocopper, or a mixture thereof, and a thickness of the hole injection layer is about 50 Å to about 100 Å; or
        the hole injection layer includes MoO$_x$ (x is in the range of 2 to 6), W$_x$O$_y$ (x is in the range of 1 to 18, and y is in the range of 2 to 49), or a mixture thereof, and a thickness of the hole injection layer is about 100 Å to about 800 Å;
    wherein the hole injection layer contacts the first electrode.

2. The organic light-emitting device as claimed in claim 1, wherein the metal of the first electrode includes silver, aluminum, or an alloy of silver and aluminum.

3. The organic light-emitting device as claimed in claim 1, wherein the hole injection layer includes the mixture of 1,4,5,8,9,12-hexaaza-triphenylene-2,3,6,7,10,11-hexacarbonitrile and hexadecafluorophthalocyaninatocopper.

4. The organic light-emitting device as claimed in claim 1, wherein the organic layer has a thickness of about 800 Å to about 1,500 Å.

5. The organic light-emitting device as claimed in claim 1, wherein:
    the first electrode is a positive electrode, and
    the second electrode is a negative electrode.

6. The organic light-emitting device as claimed in claim 1, wherein the first electrode has a thickness of about 200 Å to about 5,000 Å.

* * * * *